(12) United States Patent  
Suwa et al.

(10) Patent No.: US 11,955,546 B2  
(45) Date of Patent: Apr. 9, 2024

(54) SEMICONDUCTOR DEVICE AND METHOD FOR CONTROLLING SAME

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Takeshi Suwa, Kawasaki Kanagawa (JP); Tomoko Matsudai, Shibuya Tokyo (JP); Yoko Iwakaji, Meguro Tokyo (JP)

(73) Assignees: Kabushiki Kaisha Toshiba, Tokyo (JP); Toshiba Electronic Devices and Storage Corporation, Tokyo (JP)

( * ) Notice: Subject to any disclaimer, the term of this patent is extended or adjusted under 35 U.S.C. 154(b) by 723 days.

(21) Appl. No.: 17/014,794

(22) Filed: Sep. 8, 2020

(65) Prior Publication Data  
US 2021/0296495 A1 Sep. 23, 2021

(30) Foreign Application Priority Data  
Mar. 18, 2020 (JP) .................. 2020-047541

(51) Int. Cl.  
*H01L 29/78* (2006.01)  
*H01L 29/423* (2006.01)  
(Continued)

(52) U.S. Cl.  
CPC ...... *H01L 29/7831* (2013.01); *H01L 29/4236* (2013.01); *H01L 29/42376* (2013.01);  
(Continued)

(58) Field of Classification Search  
CPC ............ H01L 29/7831; H01L 29/4236; H01L 29/42376; H01L 29/7397; H01L 29/7813;  
(Continued)

(56) References Cited

U.S. PATENT DOCUMENTS 9,299,830 B1   3/2016 Kawahara et al.  
2020/0083879 A1* 3/2020 Tanaka ................ H01L 29/0696  
(Continued)

FOREIGN PATENT DOCUMENTS

JP   2008227514 A   9/2008  
JP   2012109580 A   6/2012  
(Continued)

*Primary Examiner* — Lincoln D Donovan  
*Assistant Examiner* — Tyler J Pereny  
(74) *Attorney, Agent, or Firm* — Kim & Stewart LLP

(57) ABSTRACT

A semiconductor device includes first and second electrodes, a semiconductor part therebetween, first to third control electrodes inside the semiconductor part, and first to third interconnects. The first and second control electrodes are arranged along a front surface of the semiconductor part. The third control electrodes are provided between the first electrode and the first and second electrodes, respectively. The first and second interconnect are electrically connected to the first and second control electrodes, respectively. The third interconnect is electrically connected to the third control electrodes. The semiconductor layer includes first and third layers of a first conductivity type and a second layer of a second conductivity type. The second layer is provided between the first layer and the second electrode. The third layer is provided between the second layer and the second electrode. The second layer faces the first and second control electrodes via insulating portions.

13 Claims, 9 Drawing Sheets

(51) Int. Cl.
*H01L 29/739* (2006.01)
*H03K 17/16* (2006.01)

(52) U.S. Cl.
CPC ...... *H01L 29/7397* (2013.01); *H01L 29/7813* (2013.01); *H03K 17/168* (2013.01)

(58) Field of Classification Search
CPC . H01L 29/0623; H01L 29/404; H01L 29/407; H01L 29/7398; H01L 29/42356; H01L 29/1608; H01L 29/66068; H01L 29/1095; H01L 29/41766; H01L 29/0696; H01L 29/0878; H01L 29/7802; H01L 29/7806; H01L 29/0619; H01L 29/41741; H01L 21/049; H01L 29/45; H01L 29/66734; H01L 29/7811; H01L 29/7805; H01L 29/7395; H01L 29/6606; H01L 21/02236; H01L 29/7827; H01L 29/66666; H01L 29/0611; H03K 17/168; H02M 7/537
See application file for complete search history.

(56) References Cited

U.S. PATENT DOCUMENTS

| | | | |
|---|---|---|---|
| 2020/0091325 A1 | 3/2020 | Matsudai et al. | |
| 2021/0134791 A1* | 5/2021 | Gejo | H01L 27/0664 |
| 2021/0134838 A1* | 5/2021 | Ibusuki | H01L 29/78654 |

FOREIGN PATENT DOCUMENTS

| | | | |
|---|---|---|---|
| JP | 2018515927 A | 6/2018 | |
| JP | 2020047756 A | 3/2020 | |
| WO | 2005065385 A2 | 7/2005 | |

* cited by examiner

US 11,955,546 B2

SEMICONDUCTOR DEVICE AND METHOD FOR CONTROLLING SAME

CROSS-REFERENCE TO RELATED APPLICATIONS

This application is based upon and claims the benefit of priority from Japanese Patent Application No. 2020-047541, filed on Mar. 18, 2020; the entire contents of which are incorporated herein by reference.

FIELD

Embodiments relate to a semiconductor device and a method for controlling the same.

BACKGROUND

It is desirable to reduce the switching loss of a power semiconductor device.

DETAILED DESCRIPTION

Figure 1:
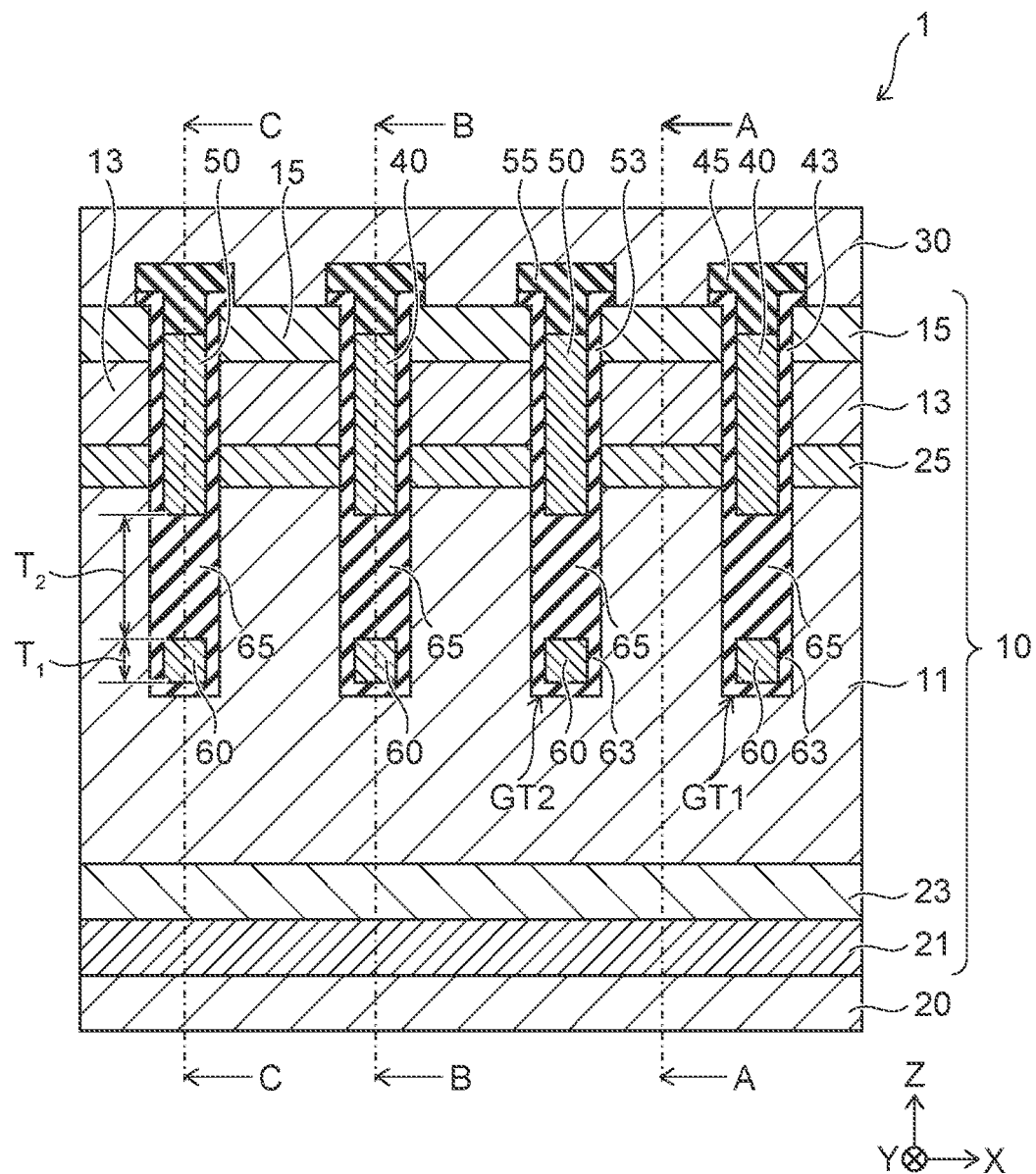
FIG. 1 is a schematic cross-sectional view illustrating a semiconductor device according to a first embodiment.

According to one embodiment, a semiconductor device includes a semiconductor part; a first electrode provided at a backside of the semiconductor part; a second electrode provided at a front side of the semiconductor part; first and second control electrodes; a plurality of third control electrodes; and first to third interconnects. The first to third control electrodes are provided between the semiconductor part and the second electrode. The first control electrode is provided inside the semiconductor part and electrically insulated from the semiconductor part by a first insulating portion. The first control electrode is electrically insulated from the second electrode by a first inter-layer insulating film. The second control electrode is provided inside the semiconductor part. The first and second control electrodes are arranged in a first direction along the front surface of the semiconductor part. The second control electrode is electrically insulated from the semiconductor part by a second insulating portion and electrically insulated from the second electrode by a second inter-layer insulating film. The second control electrode is electrically isolated from the first control electrode. The third control electrodes are provided respectively between the first control electrode and the first electrode and between the second control electrode and the first electrode. The third control electrodes are provided inside the semiconductor part. The third control electrodes each are electrically insulated from the semiconductor part by a third insulating portion. The third control electrodes are electrically insulated respectively from the first and second control electrodes by a fourth insulating portion. The first interconnect is electrically connected to the first control electrode. The second interconnect is electrically connected to the second control electrode. The third interconnect is connected to the plurality of third control electrodes. The semiconductor layer includes a first layer of a first conductivity type, a second layer of a second conductivity type, a third layer of the first conductivity type, and a fourth layer of the second conductivity type. The first layer extends between the first electrode and the second electrode; and the third control electrode is provided inside the first layer. The second layer is provided between the first layer and the second electrode. The second layer faces the first control electrode via the first insulating portion and faces the second control electrode via the second insulating portion. The third layer is selectively provided between the second layer and the second electrode. The third layer contacts the first insulating portion and is electrically connected to the second electrode. The fourth layer is provided between the first layer and the first electrode, and electrically connected to the first electrode.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a schematic cross-sectional view illustrating a semiconductor device 1 according to a first embodiment. The semiconductor device 1 is, for example, an IGBT (Insulated Gate Bipolar Transistor). The semiconductor device 1 includes multiple gate electrodes that are controlled independently.

As shown in FIG. 1, the semiconductor device 1 includes a semiconductor part 10, a first electrode (hereinbelow, a collector electrode 20), a second electrode (hereinbelow, an emitter electrode 30), a first control electrode (hereinbelow, a gate electrode 40), a second control electrode (hereinbelow, a gate electrode 50), and a third control electrode (hereinbelow, a gate electrode 60).

The semiconductor part 10 is, for example, silicon. The semiconductor part 10 provided between the collector electrode 20 and the emitter electrode 30. The collector electrode 20 is provided at the backside of the semiconductor part 10. The emitter electrode 30 is provided at the front side of the semiconductor part 10. The collector electrode 20 and the emitter electrode 30 are, for example, metal layers including aluminum.

The gate electrodes 40 and 50 are provided between the semiconductor part 10 and the emitter electrode 30. The semiconductor part 10 includes gate trenches GT1 and GT2 provided in the front side of the semiconductor part 10. The gate electrodes 40 and 50 are provided respectively inside the gate trenches GT1 and GT2.

Multiple gate electrodes 60 are provided respectively inside the gate trenches GT1 and GT2. The gate electrodes 60 are provided between the collector electrode 20 and the gate electrode 40 and between the collector electrode 20 and the gate electrode 50.

The gate trench GT1 includes an insulating film electrically insulating the gate electrode 40 and the gate electrode 60 from the semiconductor part 10. The gate trench GT2 includes another insulating film electrically insulating the gate electrode 50 and the gate electrode 60 from the semiconductor part 10.

The gate electrode 40 is electrically insulated from the semiconductor part 10 by a first insulating portion (hereinbelow, a gate insulating film 43). An inter-layer insulating film 45 is provided between the emitter electrode 30 and the gate electrode 40. The inter-layer insulating film 45 electrically insulates the gate electrode 40 from the emitter electrode 30.

The gate electrode 50 is electrically insulated from the semiconductor part 10 by a second insulating portion (hereinbelow, a gate insulating film 53). An inter-layer insulating film 55 is provided between the emitter electrode 30 and the gate electrode 40 and electrically insulates the gate electrode 50 from the emitter electrode 30.

The gate electrode 60 is electrically insulated from the semiconductor part 10 by a third insulating portion (hereinbelow, a gate insulating film 63). Fourth insulating portions (hereinbelow, insulating films 65) are provided between the gate electrode 60 and the gate electrode 40 and between the gate electrode 60 and the gate electrode 50. The insulating films 65 electrically insulate the gate electrodes 60 from the gate electrodes 40 and 50.

The gate electrodes 40, 50, and 60 are, for example, conductive polysilicon. The gate insulating films 43, 53, and 63, the inter-layer insulating films 45 and 55, and the insulating film 65 are, for example, silicon oxide films.

The semiconductor part 10 includes, for example, first to fifth layers.

The first layer (hereinbelow, an n-type base layer 11) extends between the collector electrode 20 and the emitter electrode 30. The gate trenches GT1 and GT2 are provided to extend inside the n-type base layer 11 from the front surface of the semiconductor part 10. The gate electrode 60 is positioned inside the n-type base layer 11.

The second layer (hereinbelow, a p-type base layer 13) is provided between the n-type base layer 11 and the emitter electrode 30. The p-type base layer 13 faces the gate electrode 40 via the gate insulating film 43 and faces the gate electrode 50 via the gate insulating film 53.

The third layer (hereinbelow, an n-type emitter layer 15) is provided between the p-type base layer 13 and the emitter electrode 30. For example, the n-type emitter layer 15 contacts the gate insulating films 43 and 53. The n-type emitter layer 15 is electrically connected to the emitter electrode 30.

The fourth layer (hereinbelow, a p-type collector layer 21) is provided between the n-type base layer 11 and the collector electrode 20. The p-type collector layer 21 is electrically connected to the collector electrode 20.

The fifth layer (hereinbelow, an n-type buffer layer 23) is provided between the n-type base layer 11 and the p-type collector layer 21. The n-type buffer layer 23 includes an n-type impurity with a higher concentration than the concentration of the n-type impurity in the n-type base layer 11.

The semiconductor part 10 further includes an n-type barrier layer 25. The n-type barrier layer 25 is provided between the n-type base layer 11 and the p-type base layer 13. The n-type barrier layer 25 includes an n-type impurity with a higher concentration than the concentration of the n-type impurity in the n-type base layer 11.

The n-type barrier layer 25 increases the potential barrier for holes moving from the n-type base layer 11 to the p-type base layer 13 and suppresses the movement of the holes. The n-type barrier layer 25 is provided to increase the density of the electrons and the holes inside the n-type base layer 11 in the ON-state.

Figure 2A:
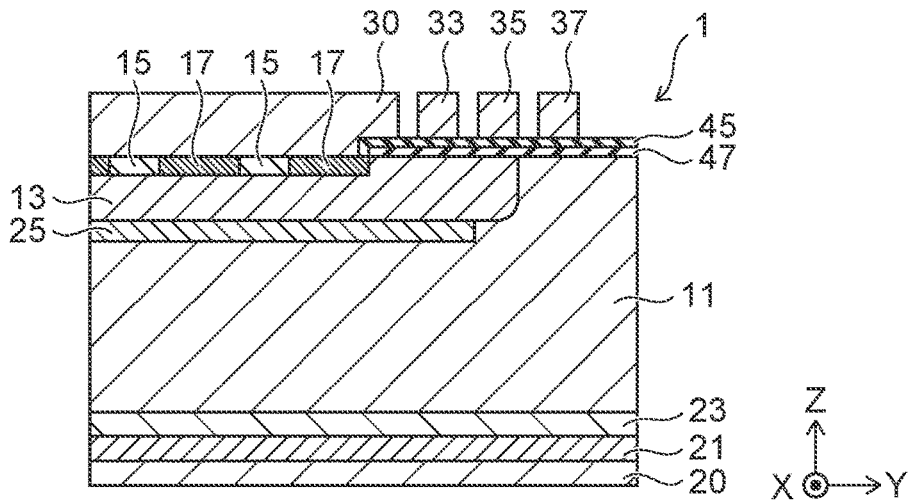
FIGS. 2A to 2C are schematic views illustrating other cross sections of the semiconductor device according to the first embodiment.
Figure 2B:
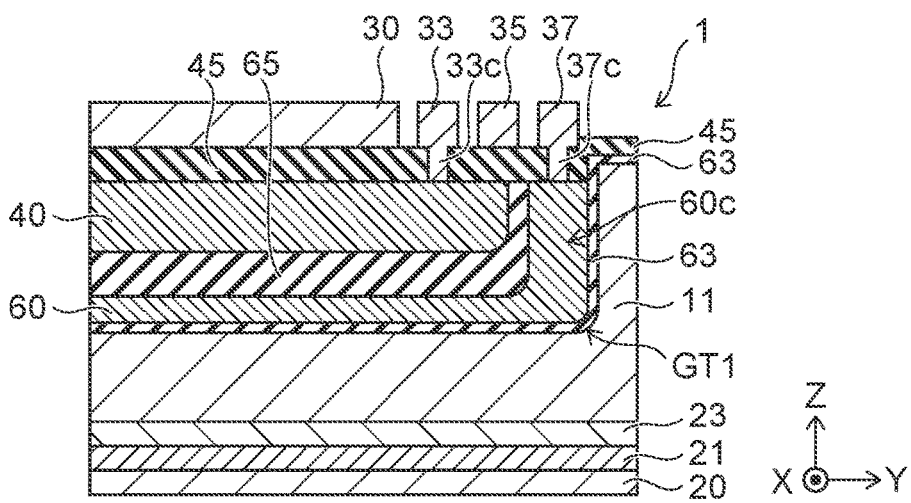
Figure 2C:
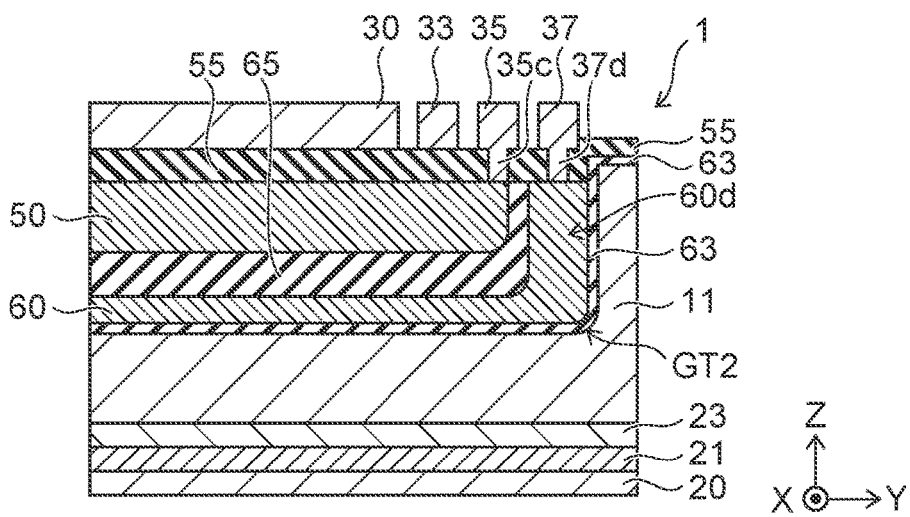

FIGS. 2A to 2C are schematic views illustrating other cross sections of the semiconductor device 1 according to the first embodiment. FIG. 2A is a cross-sectional view along line A-A shown in FIG. 1. FIG. 2B is a cross-sectional view along line B-B shown in FIG. 1. FIG. 2C is a cross-sectional view along line C-C shown in FIG. 1.

As shown in FIG. 2A, the semiconductor device 1 includes a first interconnect (hereinbelow, a gate interconnect 33), a second interconnect (hereinbelow, a gate interconnect 35), and a third interconnect (hereinbelow, a gate interconnect 37). For example, the gate interconnects 33, 35, and 37 are electrically insulated from the semiconductor part 10 by the inter-layer insulating film 45 and an insulating film 47. The insulating film 47 is, for example, a silicon oxide film.

The semiconductor part 10 further includes a p-type contact layer 17. The p-type contact layer 17 is selectively provided between the p-type base layer 13 and the emitter electrode 30. The emitter electrode 30 is electrically connected to the p-type contact layer 17. Multiple n-type emitter layers and multiple p-type contact layers 17 are arranged alternately in a direction (e.g., the Y-direction) along the front surface of the semiconductor part 10.

As shown in FIG. 2B, for example, the gate interconnect 33 is electrically connected to the gate electrode 40 via a contact portion 33c. The contact portion 33c extends through the inter-layer insulating film 45 and contacts the gate electrode 40. For example, the gate interconnect 37 is electrically connected to the gate electrode 60 via a contact portion 37c. The contact portion 37c extends through the inter-layer insulating film 45 and contacts the gate electrode 60.

The gate electrode 60 includes, for example, a connection portion 60c provided at the end portion of the gate trench GT1. The connection portion 60c has an upper end positioned at the same level as the upper end of the gate electrode 40. The contact portion 37c contacts the connection portion 60c.

As shown in FIG. 2C, for example, the gate interconnect 35 is electrically connected to the gate electrode 50 via a contact portion 35c. The contact portion 35c extends through the inter-layer insulating film 55 and contacts the gate electrode 50. For example, the gate interconnect 37 is electrically connected to the gate electrode 60 via a contact portion 37d. The contact portion 37d extends through the inter-layer insulating film 55 and contacts the gate electrode 60.

The gate electrode 60 includes, for example, a connection portion 60d provided at the end portion of the gate trench GT2. The upper end of the connection portion 60d is positioned at the same level as the upper end of the gate electrode 50. The contact portion 37d contacts the connection portion 60d.

Thus, the semiconductor device 1 includes the gate electrodes 40, 50, and 60 that are controlled independently. The gate electrodes 40, 50, and 60 are biased independently from each other via the gate interconnects 33, 35, and 37. For example, the gate interconnects 33, 35, and 37 are connected to gate terminals, e.g., gate pads (not-illustrated).

Figure 3:
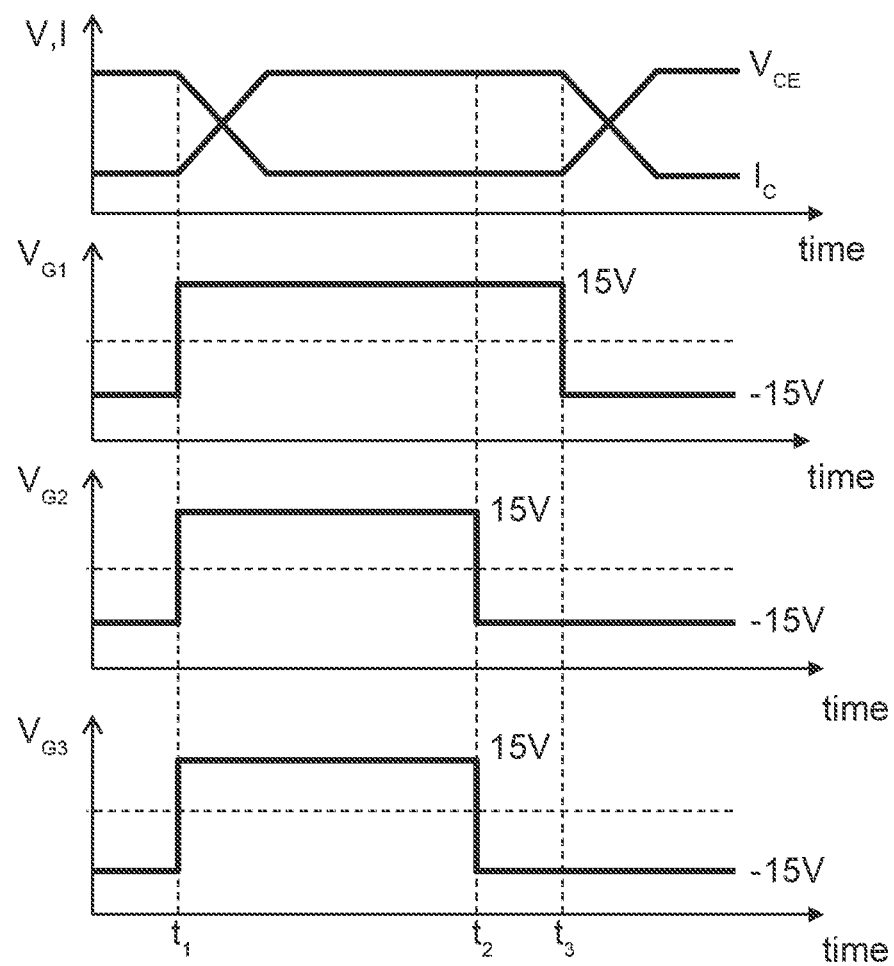
FIG. 3 is a time chart illustrating a method for controlling the semiconductor device according to the first embodiment.

FIG. 3 is a time chart illustrating a method for controlling the semiconductor device 1 according to the first embodiment. FIG. 3 shows the temporal changes of the gate voltages applied to the gate electrodes 40, 50, and 60 and the corresponding changes of a collector current $I_C$ and a collector-emitter voltage $V_{CE}$.

For example, between the collector electrode 20 and the emitter electrode 30, the collector electrode 20 is biased to have a higher potential than the potential of the emitter electrode 30.

A gate voltage $V_{G1}$ is applied between the emitter electrode 30 and the gate electrode 40 via the gate interconnect 33.

A gate voltage $V_{G2}$ is applied between the emitter electrode 30 and the gate electrode 50 via the gate interconnect 35.

A gate voltage $V_{G3}$ is applied between the emitter electrode 30 and the gate electrode 60 via the gate interconnect 37.

The method for controlling the semiconductor device 1 will now be described with reference to FIG. 1 and FIG. 3.

At a first timing $t_1$ as shown in FIG. 3, the gate voltage $V_{G1}$ is changed from a low level (e.g., negative 15 V) less than the threshold voltage of the gate electrode 40 to a high level (e.g., positive 15 V) greater than the threshold voltage.

Also, at the first timing $t_1$, the gate voltage $V_{G2}$ is increased from a low level (negative 15 V) less than the threshold voltage of the gate electrode 50 to a high level (positive 15 V) greater than the threshold voltage.

Thereby, n-type inversion layers are induced at the interface between the p-type base layer 13 and the gate insulating film 43 and the interface between the p-type base layer 13 and the gate insulating film 53. Accordingly, the collector current $I_C$ increases, and the collector-emitter voltage $V_{CE}$ decreases. In other words, the semiconductor device 1 transitions from the OFF-state to the ON-state.

Also, at the first timing $t_1$, the gate voltage $V_{G3}$ is increased from, for example, negative 15 V to positive 15 V, and, for example, an n-type accumulation layer is induced at the interface between the n-type base layer 11 and the gate insulating film 63. Thereby, an electron current flows from the emitter electrode 30 toward the collector electrode 20 via the n-type inversion layer and the n-type accumulation layer. In other words, the electron current flows through the vicinities of the gate trenches GT1 and GT2. On the other hand, the hole current that flows from the collector electrode 20 toward the emitter electrode 30 flows through the center between the adjacent gate trench GT1 and gate trench GT2.

As a result, the flows of the electrons and the holes inside the n-type base layer 11 are smooth, and the ON-resistance can be reduced.

Continuing, at a second timing $t_2$ after the first timing $t_1$, the gate voltage $V_{G2}$ is changed from the high level greater than the threshold voltage of the gate electrode 50 to the low level less than the threshold voltage. Also, at the second timing $t_2$, the gate voltage $V_{G3}$ is reduced from, for example, positive 15 V to negative 15 V.

Thereby, the n-type inversion layer that is induced at the interface between the p-type base layer 13 and the gate insulating film 53 disappears, and the electron injection from the emitter electrode 30 into the n-type base layer 11 via the n-type inversion layer decreases. Therefore, the density of the electrons and the holes inside the n-type base layer 11 decreases.

A p-type inversion layer is induced between the n-type base layer 11 and the gate insulating film 63 by the negative gate voltage $V_{G3}$ applied to the gate electrode 60. Thereby, the hole current that flows from the collector electrode 20 toward the emitter electrode 30 flows through the vicinities of the gate trenches GT1 and GT2. On the other hand, the electron current that flows from the emitter electrode 30 to the collector electrode 20 via the n-type inversion layer flows through the center between the adjacent gate trench GT1 and gate trench GT2. Thereby, the electrons and the holes move smoothly inside the n-type base layer 11, and the ON-resistance can be reduced.

At a third timing $t_3$ after the second timing $t_2$, the gate voltage $V_{G1}$ is reduced from the high level (e.g., positive 15 V) greater than the threshold voltage of the gate electrode 40 to the low level (e.g., negative 15 V) less than the threshold voltage.

Thereby, the n-type inversion layer that is induced at the interface between the p-type base layer 13 and the gate insulating film 43 disappears, the collector current $I_C$ decreases, and the collector-emitter voltage $V_{CE}$ increases. As a result, the semiconductor device 1 transitions from the ON-state to the OFF-state.

In the embodiment, the density of the electrons and the holes in the n-type base layer 11 is reduced beforehand between the second timing $t_2$ and the third timing $t_3$; thereby, after the third timing $t_3$, the times for the electrons inside the n-type base layer 11 to be ejected into the collector electrode 20 and for the holes to be ejected into the emitter electrode 30 can be shortened. In other words, in the turn-off process of the semiconductor device 1, the turn-off loss can be reduced by shortening the time necessary to deplete the n-type base layer 11. Also, by applying the negative voltage to the gate electrode 60, the depletion layer can be promoted to spread inside the n-type base layer 11, and the turn-off loss can be reduced further.

To promote the spreading of the depletion layer inside the n-type base layer 11, for example, it is preferable for the gate electrode 60 to be provided at the center of the n-type base layer 11. Therefore, the spacing between the gate electrode 40 and the gate electrode 60 and the spacing between the gate electrode 50 and the gate electrode 60 may be wider. As shown in FIG. 1, for example, the spacings between the gate electrodes 60 and the gate electrodes 40 and between the gate electrodes 60 and the gate electrodes 50 are greater than the width in the Z-direction of the gate electrode 60. In other words, the insulating film 65 that is provided between the gate electrode 60 and the gate electrode 40 and between the gate electrode 60 and the gate electrode 50 has a width $T_2$ in the Z-direction that is greater than a width $T_1$ in the Z-direction of the gate electrode 60 (referring to FIG. 1).

Figure 4A:
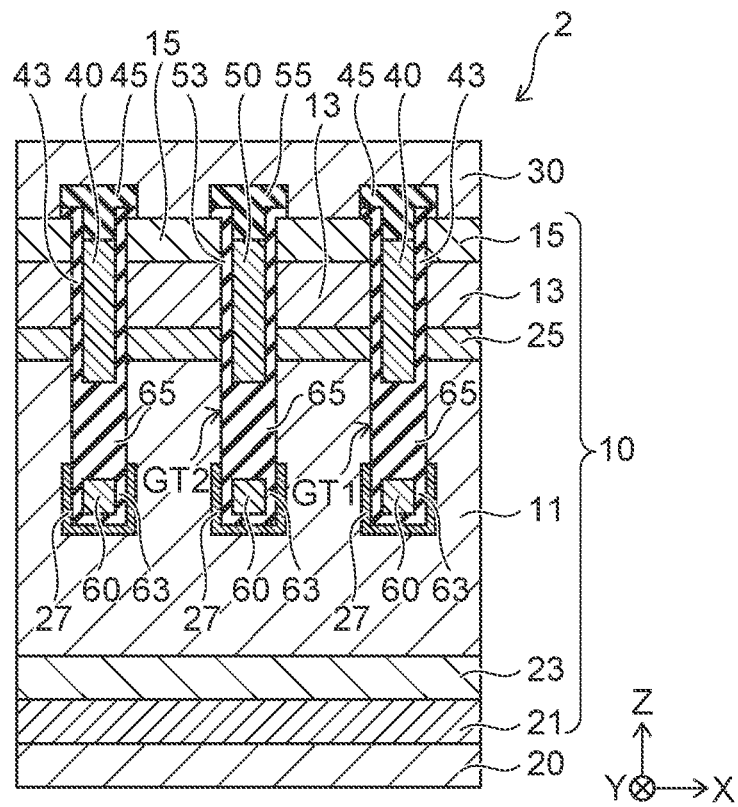
FIGS. 4A and 4B are schematic cross-sectional views illustrating semiconductor devices according to a first modification of the first embodiment.
Figure 4B:
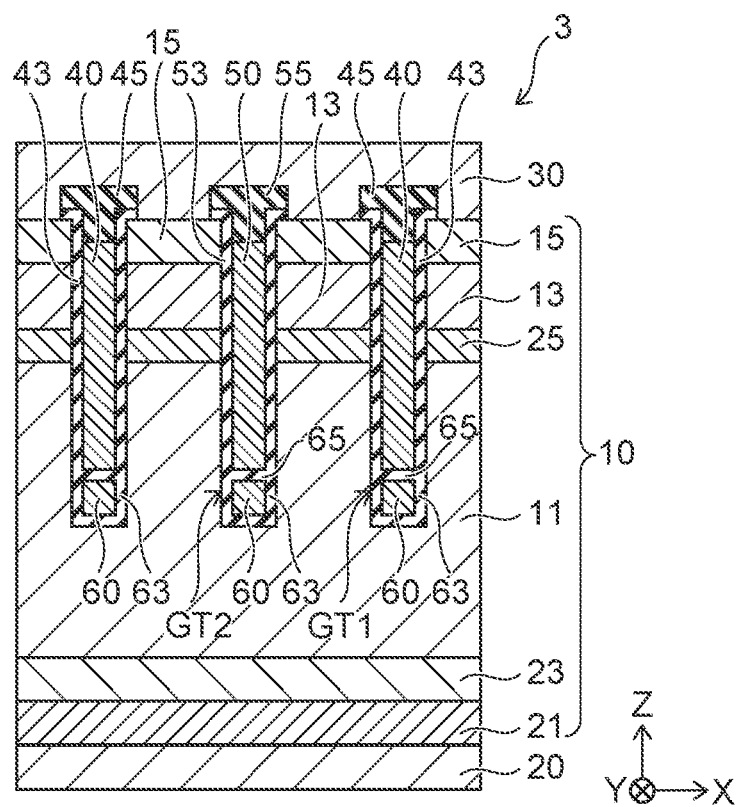

FIGS. 4A and 4B are schematic cross-sectional views illustrating semiconductor devices 2 and 3 according to a first modification of the first embodiment.

In the semiconductor device 2 shown in FIG. 4A, the semiconductor part 10 further includes a p-type semiconductor region 27 provided inside the n-type base layer 11. The p-type semiconductor region 27 is provided to surround the gate electrode 60 along the gate insulating film 63.

For example, it is preferable for the p-type semiconductor region 27 to be inverted into an n-type region by the gate voltage $V_{G3}$ applied between the emitter electrode 30 and the gate electrode 60. For example, it is preferable for the p-type impurity concentration of the p-type semiconductor region 27 to be set so that the p-type semiconductor region 27 is inverted to the n-type by electrons attracted to the interface between the p-type semiconductor region 27 and the gate insulating film 63 when the gate voltage $V_{G3}$ (referring to FIG. 3) is set to positive 15 V.

When the p-type semiconductor region 27 is provided, for example, the gate voltage $V_{G3}$ is controlled to rise from 0 V to positive 15 V and to drop from positive 15 V to 0 V.

An n-type semiconductor region may be provided instead of the p-type semiconductor region 27. Although the p-type semiconductor regions 27 are provided at the lower ends of both the gate trenches GT1 and GT2 in the example, the p-type semiconductor region 27 may be provided at one of the lower ends.

In the semiconductor device 3 shown in FIG. 4B, the gate electrodes 40 and 50 extend to the vicinities of the gate electrodes 60. For example, the widths in the Z-direction of the insulating films 65 provided between the gate electrode 60 and the gate electrode 40 and between the gate electrode 60 and the gate electrode 50 are less than the width in the Z-direction of the gate electrode 60.

In the semiconductor device 3, when negative gate voltages are applied to the gate electrodes 40, 50, and 60, p-type inversion layers are induced at the interface between the n-type base layer 11 and the gate insulating film 43, the interface between the n-type base layer 11 and the gate insulating film 53, and the interface between the n-type base layer 11 and the gate insulating film 63. Therefore, the p-type semiconductor region 27 and the p-type base layer 13 are electrically connected, and the hole ejection path is formed from the n-type base layer 11 to the emitter electrode 30. Thereby, the movement of the holes to the emitter electrode 30 is smooth, and the ON-resistance can be reduced further.

Figure 5A:
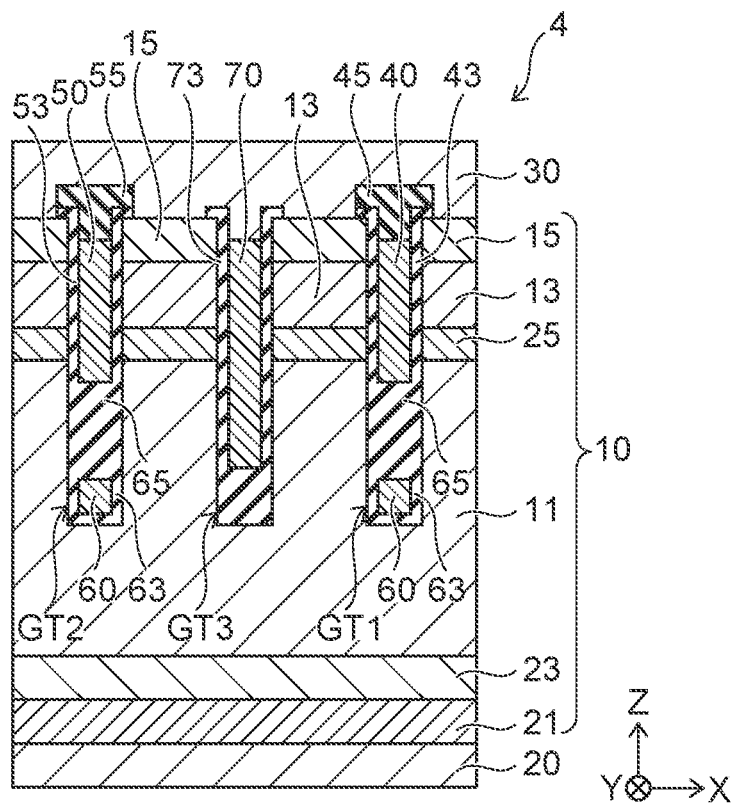
FIGS. 5A and 5B are schematic cross-sectional views respectively illustrating semiconductor devices according to a second modification of the first embodiment.
Figure 5B:
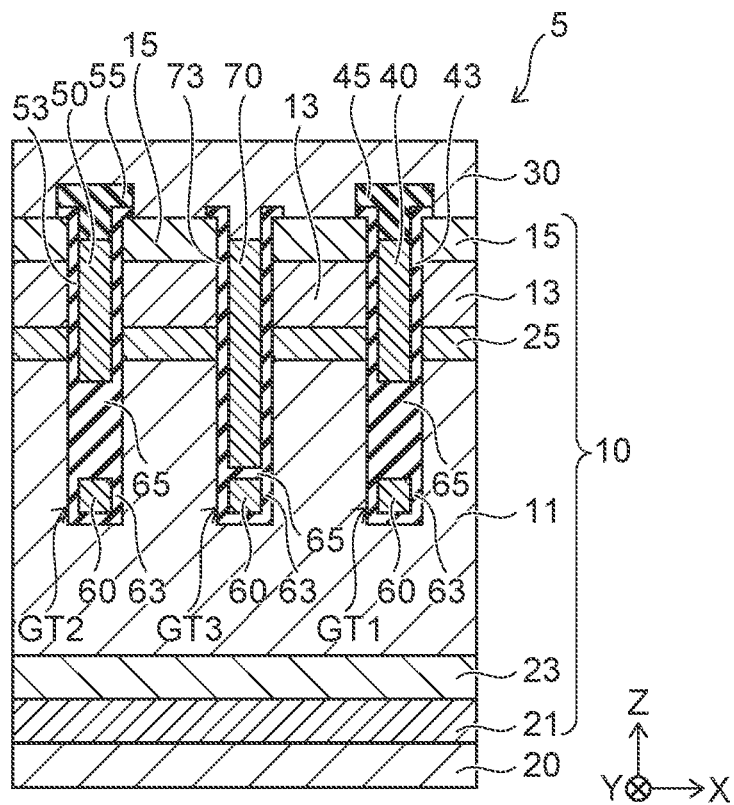

FIGS. 5A and 5B are schematic cross-sectional views respectively illustrating semiconductor devices 4 and 5 according to a second modification of the first embodiment. In the semiconductor devices 4 and 5, an emitter plate 70 is provided between the gate electrode 40 and the gate electrode 50. The emitter plate 70 is electrically connected to the emitter electrode 30. The emitter plate 70 is, for example, conductive polysilicon.

As shown in FIG. 5A, the emitter plate 70 is positioned between the semiconductor part 10 and the emitter electrode 30. The emitter plate 70 is disposed inside a gate trench GT3 provided in the semiconductor part 10.

For example, the gate trench GT3 extends into the n-type base layer 11 from the front surface of the semiconductor part 10. The emitter plate 70 also extends into the n-type base layer 11. For example, the emitter plate 70 is electrically insulated from the semiconductor part 10 by an insulating film 73. The p-type base layer 13 faces the emitter plate 70 via the insulating film 73. The insulating film 73 is, for example, a silicon oxide film.

As shown in FIG. 5B, the gate electrode 60 may be provided between the collector electrode 20 and the emitter plate 70 inside the gate trench GT3. For example, the gate electrode 60 is electrically insulated from the emitter plate 70 by the insulating film 65.

By providing the emitter plate 70 in the example, the interference can be avoided between the collector currents control by the gate electrode 40 and the gate electrode 50. In other words, the holes from the n-type base layer 11 to the p-type base layer 13 and the electron injection from the emitter electrode 30 to the n-type base layer 11 via the n-type inversion layer move more smoothly, and the ON-resistance can be reduced.

Figure 6:
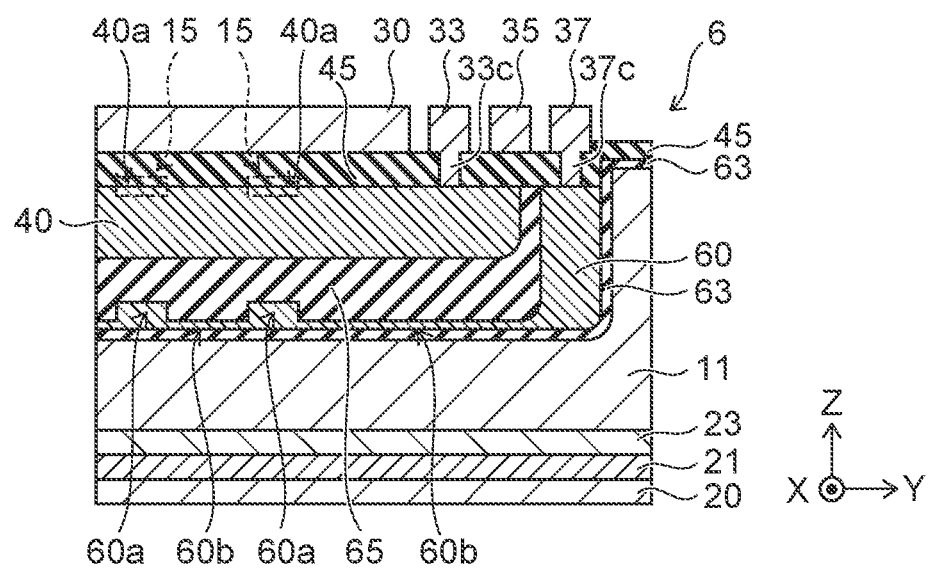
FIG. 6 is a schematic cross-sectional view illustrating a semiconductor device according to a third modification of the first embodiment.

FIG. 6 is a schematic cross-sectional view illustrating a semiconductor device 6 according to a third modification of the first embodiment.

FIG. 6 is a cross-sectional view corresponding to the cross section shown in FIG. 2B.

As shown in FIG. 6, the gate electrode 40 includes a region 40a facing the n-type emitter layer 15 via the gate insulating film 43 (referring to FIG. 1). For example, in the ON-state, the electrons that are injected from the emitter electrode 30 into the n-type base layer 11 move via an n-type inversion layer induced between the n-type emitter layer 15 and the gate insulating film 43. In other words, the electrons move in the direction from the region 40a toward the n-type base layer 11.

The gate electrode 60 shown in FIG. 6 includes a first portion 60a and a second portion 60b. The first portion 60a and the second portion 60b are provided between the collector electrode 20 and the gate electrode 40. The first portion 60a is provided between the collector electrode 20 and the region 40a of the gate electrode 40. The thickness in the Z-direction of the first portion 60a is greater than the thickness in the Z-direction of the second portion 60b.

For example, in the ON-state, the gate voltage $V_{G3}$ of positive 15 V is applied to the gate electrode 60, and an n-type accumulation layer is induced between the n-type base layer 11 and the gate insulating film 63 (referring to FIG. 3). Thereby, the electrons that are injected from the emitter electrode 30 via the n-type inversion layer are controlled to move via the n-type accumulation layer. At this time, by providing the first portion 60a between the collector electrode 20 and the region 40a of the gate electrode 40, the electrons can move concentratedly in the direction from the region 40a toward the first portion 60a. On the other hand, the holes move from the second portion 60b toward a portion of the gate electrode 40 other than the region 40a. As a result, the electrons and the holes move separately inside the n-type base layer 11, and the ON-resistance can be reduced further.

Although the gate electrode 60 illustrated in FIG. 6 is provided inside the gate trench GT1 with the gate electrode 40, the gate electrode 60 is not limited thereto. For example, the first portion 60a and the second portion 60b may be provided in the gate electrode 60 that is disposed inside the gate trench GT2 with the gate electrode 50.

Figure 7A:
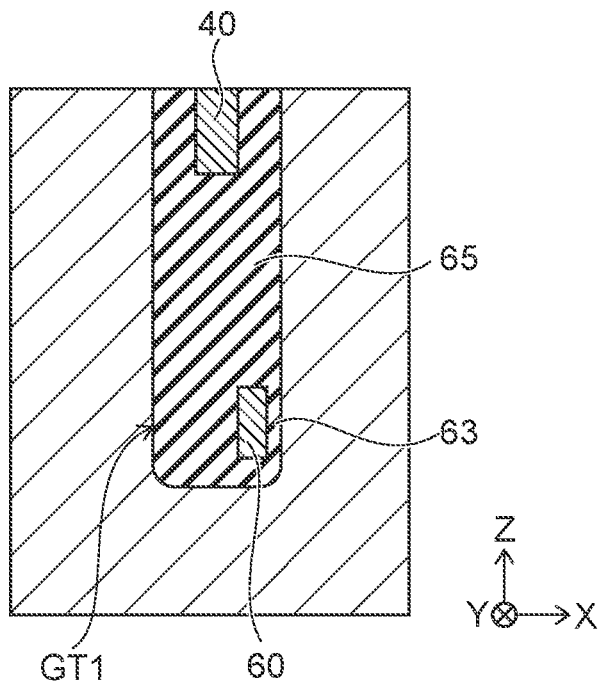
FIGS. 7A and 7B are schematic cross-sectional views illustrating the gate electrode of a semiconductor device according to a fourth modification of the first embodiment.
Figure 7B:
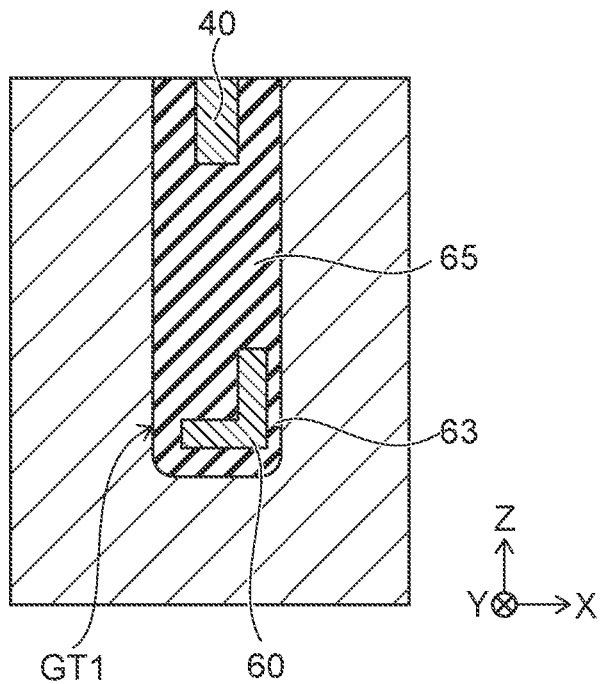

FIGS. 7A and 7B are schematic cross-sectional views illustrating the gate electrode 60 of a semiconductor device according to a fourth modification of the first embodiment. The cross-sectional configuration of the gate electrode 60 is not limited to the example described above; it is sufficient for the configuration to be capable of achieving the desired current capacity and field effects.

As shown in FIG. 7A, at the bottom portion of the gate trench GT1, the gate electrode 60 may be provided at the vicinity of one sidewall. For example, by providing the gate electrode 60 at a position where the gate electrode 60 faces the region through which the ON-current flows, the holes and the electrons move separately, and thereby, the current capacity can be increased.

As shown in FIG. 7B, at the bottom portion of the gate trench GT1, the gate electrode 60 may be provided along the bottom surface and one sidewall.

Second Embodiment

Figure 8:
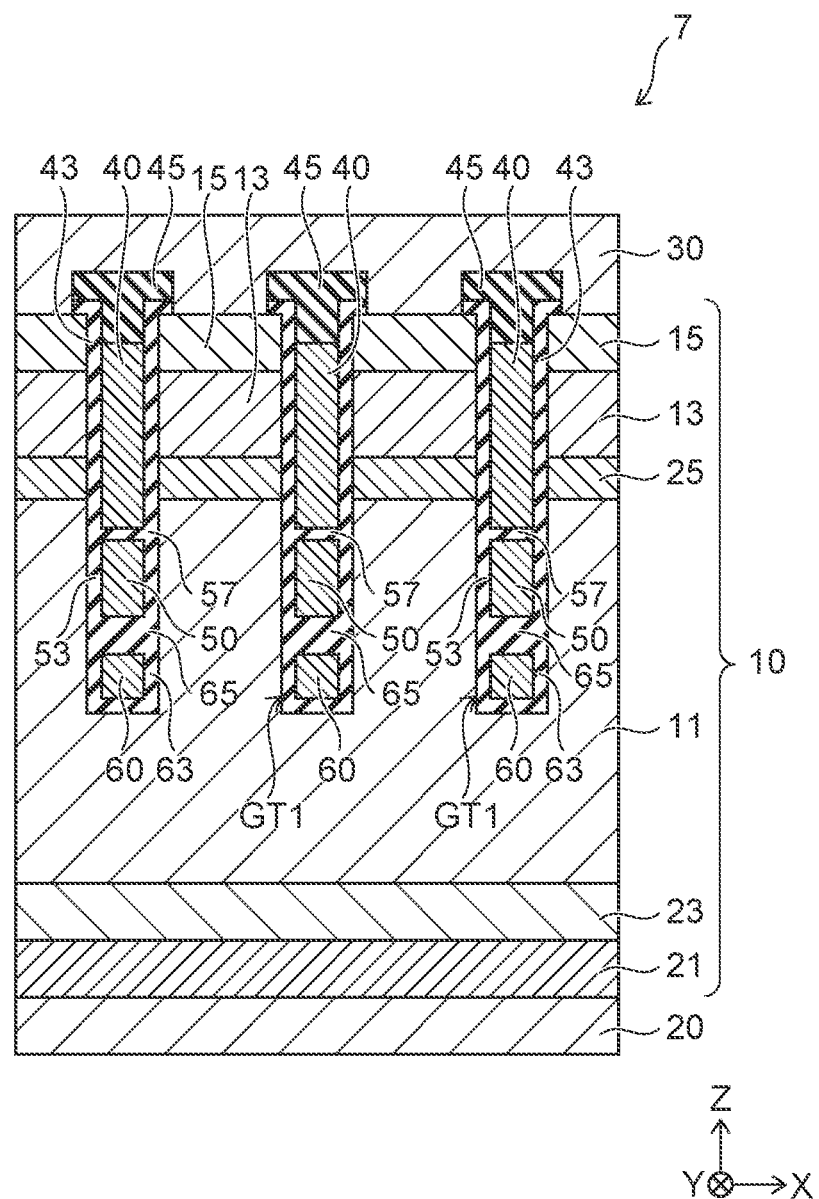
FIG. 8 is a schematic cross-sectional view illustrating a semiconductor device according to a second embodiment.

FIG. 8 is a schematic cross-sectional view illustrating a semiconductor device 7 according to a second embodiment. In the example, the gate electrodes 40, 50, and 60 are provided inside the same gate trench GT1.

The gate electrode 40 is provided to face the p-type base layer 13 via the gate insulating film 43 between the collector electrode 20 and the emitter electrode 30.

The gate electrode 50 is provided to face the n-type base layer 11 via the gate insulating film 53 between the collector electrode 20 and the gate electrode 40.

The gate electrode 60 is provided to face the n-type base layer 11 via the gate insulating film 63 between the collector electrode 20 and the gate electrode 50.

The gate electrode 40 and the gate electrode 50 are electrically insulated from each other by an insulating film 57. The gate electrode 50 and the gate electrode 60 are electrically insulated from each other by the insulating film 65. The insulating film 57 is, for example, a silicon oxide film.

For example, by applying the negative gate voltage $V_{G2}$ to the gate electrode 50 (referring to FIG. 3), a p-type inversion layer is formed at the interface between the n-type base layer 11 and the gate insulating film 53. By applying the negative gate voltage $V_{G3}$ to the gate electrode 60 (referring to FIG. 3), a p-type inversion layer is formed at the interface between the n-type base layer 11 and the gate insulating film 63. Thereby, the hole ejection path can be formed from the n-type base layer 11 to the p-type base layer 13, and the hole ejection can be promoted inside the n-type base layer 11. Also, the depletion of the n-type base layer 11 can be promoted.

By applying the positive gate voltage $V_{G2}$ to the gate electrode 50 (referring to FIG. 3), an n-type accumulation layer is formed at the interface between the n-type base layer 11 and the gate insulating film 53. By applying the positive gate voltage $V_{G3}$ to the gate electrode 60 (referring to FIG. 3), an n-type accumulation layer is formed at the interface between the n-type base layer 11 and the gate insulating film 63. Thereby, the flow path of the electron current to the n-type inversion layer induced at the interface between the p-type base layer 13 and the gate insulating film 43 can be formed, and the ON-resistance can be reduced.

Figure 9A:
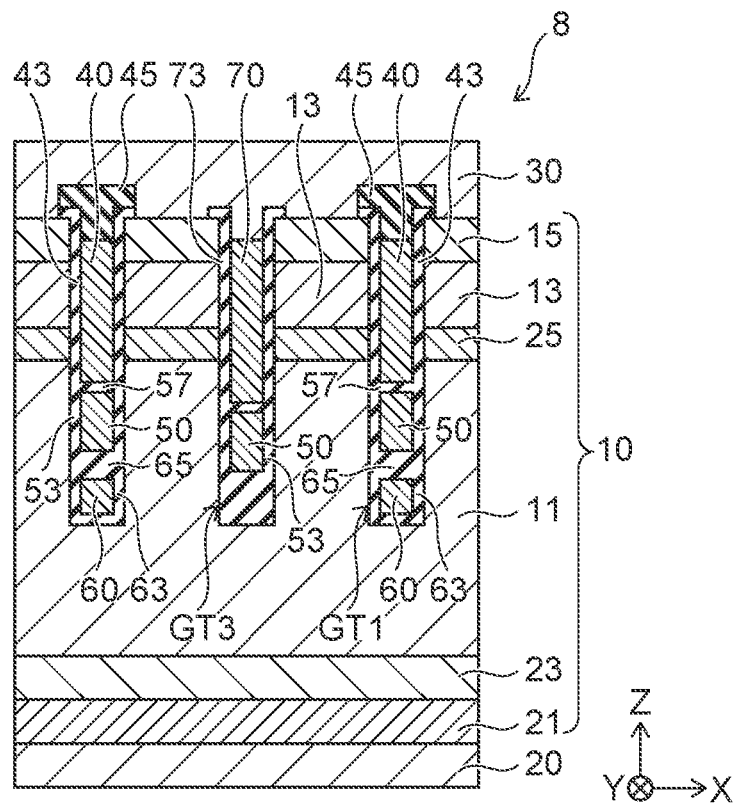
FIGS. 9A and 9B are schematic cross-sectional views illustrating semiconductor devices according to a modification of the second embodiment.
Figure 9B:
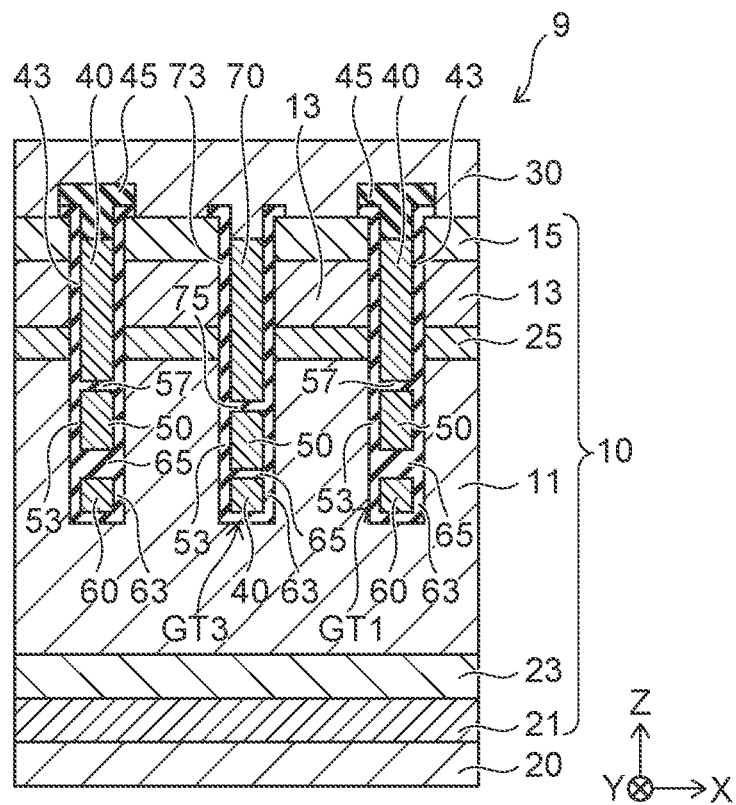

FIGS. 9A and 9B are schematic cross-sectional views illustrating semiconductor devices 8 and 9 according to a modification of the second embodiment. In the semiconductor devices 8 and 9, the gate electrodes 40, 50, and 60 are provided inside the same gate trench GT1. Also, the emitter plate 70 is provided between the two adjacent gate electrodes 40.

As shown in FIGS. 9A and 9B, the emitter plate 70 is provided inside the gate trench GT3 and electrically connected to the emitter electrode 30. The emitter plate 70 is electrically insulated from the semiconductor part 10 by the insulating film 73.

In the semiconductor device 8 shown in FIG. 9A, a gate electrode 50 is also provided between the collector electrode 20 and the emitter plate 70. The gate electrode 50 is provided inside the gate trench GT3 and electrically insulated from the semiconductor part 10 by the gate insulating film 53. The gate electrode 50 and the emitter plate 70 are electrically insulated from each other by an insulating film 75. The insulating film 75 is, for example, a silicon oxide film.

For example, the gate electrode 50 is controlled to induce a p-type inversion layer at the interface between the n-type base layer 11 and the gate insulating film 53 positioned inside the n-type base layer 11. Thereby, the hole ejection is promoted inside the n-type base layer 11.

In the semiconductor device 9 shown in FIG. 9B, the gate electrodes 50 and 60 are also provided inside the gate trench GT3. The gate electrode 50 is provided between the collector electrode 20 and the emitter plate 70. The gate electrode 60 is provided between the collector electrode 20 and the gate electrode 50. For example, the gate electrodes 50 and 60 are positioned inside the n-type base layer 11.

The gate electrode 50 is electrically insulated from the semiconductor part 10 by the gate insulating film 53, and the gate electrode 60 is electrically insulated from the semiconductor part 10 by the gate insulating film 63.

For example, the gate electrode 50 is controlled to induce a p-type inversion layer at the interface between the n-type base layer 11 and the gate insulating film 53. Thereby, hole ejection is promoted inside the n-type base layer 11.

For example, the gate electrode 60 is controlled to induce a p-type inversion layer at the interface between the n-type base layer 11 and the gate insulating film 53. Thereby, the hole ejection is promoted inside the n-type base layer 11. Also, the gate electrode 60 promotes the depletion of the n-type base layer 11.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a semiconductor part;
   a first electrode provided at a backside of the semiconductor part;
   a second electrode provided at a front side of the semiconductor part;
   a first control electrode provided between the semiconductor part and the second electrode, the first control electrode being provided inside the semiconductor part and electrically insulated from the semiconductor part by a first insulating portion, the first control electrode being electrically insulated from the second electrode by a first inter-layer insulating film;
   a second control electrode provided between the semiconductor part and the second electrode, the second control electrode being provided inside the semiconductor part, the first and second control electrodes being arranged in a first direction along a front surface of the semiconductor part, the second control electrode being electrically insulated from the semiconductor part by a second insulating portion and electrically insulated from the second electrode by a second inter-layer insulating film, the second control electrode being electrically isolated from the first control electrode;

a plurality of third control electrodes provided respectively between the first control electrode and the first electrode and between the second control electrode and the first electrode, the third control electrodes being provided inside the semiconductor part, the third control electrodes each being electrically insulated from the semiconductor part by a third insulating portion, the third control electrodes being electrically insulated respectively from the first and second control electrodes by a fourth insulating portion;

a first interconnect electrically connected to the first control electrode;

a second interconnect electrically connected to the second control electrode; and a third interconnect connected to the plurality of third control electrodes, the semiconductor part including a first layer of a first conductivity type, a second layer of a second conductivity type, a third layer of the first conductivity type, and a fourth layer of the second conductivity type, the first layer extending between the first electrode and the second electrode, the third control electrodes being provided inside the first layer, the second layer being provided between the first layer and the second electrode, the second layer facing the first control electrode via the first insulating portion and facing the second control electrode via the second insulating portion, the third layer being selectively provided between the second layer and the second electrode, the third layer contacting the first insulating portion and being electrically connected to the second electrode, the fourth layer being provided between the first layer and the first electrode and electrically connected to the first electrode, and the third control electrodes each having a thickness in a second direction from the first electrode toward the second electrode, the thickness of the third control electrodes being less than a thickness in the second direction of the fourth insulating portion.

2. The semiconductor device according to claim 1, wherein
the semiconductor part further includes a fifth layer of the second conductivity type, the fifth layer being selectively provided between the second layer and the second electrode, the fifth layer being electrically connected to the second electrode, and
the fifth layer includes a second conductivity type impurity with a higher concentration than a concentration of a second conductivity type impurity in the second layer.

3. The semiconductor device according to claim 1, wherein
the semiconductor part further includes a sixth layer of the first conductivity type, the sixth layer being provided between the first layer and the second layer, the sixth layer including a first conductivity type impurity with a higher concentration than a concentration of a first conductivity type impurity in the first layer, and
the first control electrode and the second control electrode face the sixth layer respectively via the first insulating portion and the second insulating portion.

4. The semiconductor device according to claim 1, wherein the third control electrodes each are provided in the semiconductor part at a center of the first layer in the second direction from the first electrode toward the second electrode.

5. The semiconductor device according to claim 1, wherein
the semiconductor part further includes a second conductivity type region provided inside the first layer, the second conductivity type region surrounding each of the third control electrodes with the third insulating portion interposed therebetween.

6. The semiconductor device according to claim 1, wherein
one of the third control electrodes includes a first portion and a second portion, the first portion being provided between the first electrode and a portion of the first control electrode facing the third layer via the first insulating portion, the second portion being provided between the first electrode and another portion of the first control electrode, and
the first and second portions have first and second thicknesses, respectively, in the second direction from the first electrode toward the second electrode, the second thickness being less than the first thickness.

7. The semiconductor device according to claim 1, further comprising:
a third electrode extending in the semiconductor part between the first control electrode and the second control electrode, the third electrode extending in the second direction from the first electrode toward the second electrode, the third electrode being electrically insulated from the semiconductor part by an insulating film and electrically connected to the second electrode.

8. The semiconductor device according to claim 7, wherein
the first control electrode and the second control electrode have lengths in the second direction, the lengths of the first and second control electrodes being less than a length in the second direction of the third electrode.

9. The semiconductor device according to claim 7, wherein
the plurality of third control electrodes includes a third control electrode provided between the first electrode and the third electrode.

10. A method for controlling a semiconductor device,
the semiconductor device comprising:
a semiconductor part;
a first electrode provided at a backside of the semiconductor part;
a second electrode provided at a front side of the semiconductor part;
a first control electrode provided between the semiconductor part and the second electrode, the first control electrode being provided inside the semiconductor part and electrically insulated from the semiconductor part by a first insulating portion, the first control electrode being electrically insulated from the second electrode by a first inter-layer insulating film;
a second control electrode provided between the semiconductor part and the second electrode, the second control electrode being provided inside the semiconductor part and electrically insulated from the semiconductor part by a second insulating portion, the first and second control electrodes being arranged in a first direction along a front surface of the semiconductor part, the second control electrode being electrically insulated from the second electrode by a second inter-layer insulating film and electrically isolated from the first control electrode;
a plurality of third control electrodes provided respectively between the first control electrode and the first electrode and between the second control electrode and the first electrode, the third control electrodes each being provided inside the semiconductor part and electrically insulated from the semiconductor part by a third insulating portion, the third control electrodes being electrically insulated respectively from the first and second control electrodes by a fourth insulating portion;
a first interconnect electrically connected to the first control electrode;
a second interconnect electrically connected to the second control electrode; and
a third interconnect connected to the plurality of third control electrodes,
the semiconductor part including a first layer of a first conductivity type, a second layer of a second conductivity type, a third layer of the first conductivity type, and a fourth layer of the second conductivity type,
the first layer extending between the first electrode and the second electrode, the third control electrodes being positioned inside the first layer,
the second layer being provided between the first layer and the second electrode, the second layer facing the first control electrode via the first insulating portion and facing the second control electrode via the second insulating portion,
the third layer being selectively provided between the second layer and the second electrode, the third layer contacting the first insulating portion and being electrically connected to the second electrode,
the fourth layer being provided between the first layer and the first electrode and electrically connected to the first electrode,
the method comprising:
biasing the second electrode to a second potential less than a first potential of the first electrode;
at a first timing, changing a first control voltage applied between the second electrode and the first control electrode from a low level less than a first threshold voltage of the first control electrode to a high level greater than the first threshold voltage;
at the first timing, changing a second control voltage applied between the second electrode and the second control electrode from a low level less than a second threshold voltage of the second control electrode to a high level greater than the second threshold voltage;
at the first timing, increasing a third control voltage applied between the second electrode and the third control electrodes to make a potential of the third control electrode to change from a low level less than the second potential to a high level greater than the second potential;
at a second timing after the first timing, changing the second control voltage from the high level greater than the second threshold voltage to a low level less than the second threshold voltage;
at the second timing, reducing the third control voltage to make the potential of the third control electrode to change from the high level greater than the second potential to a low level less than the second potential; and at a third timing after the second timing, changing the first control voltage from the high level greater than the first threshold voltage to a low level less than the first threshold voltage.

11. A semiconductor device, comprising:
a semiconductor part;
a first electrode provided at a backside of the semiconductor part;
a second electrode provided at a front side of the semiconductor part;
a first control electrode provided between the semiconductor part and the second electrode, the first control electrode being provided inside the semiconductor part and electrically insulated from the semiconductor part by a first insulating portion, the first control electrode being electrically insulated from the second electrode by a first inter-layer insulating film;
a second control electrode provided between the first control electrode and the first electrode, the second control electrode being provided inside the semiconductor part and electrically insulated from the semiconductor part by a second insulating portion; and
a third control electrode provided between the second control electrode and the first electrode, the third control electrode being provided inside the semiconductor part and electrically insulated from the semiconductor part by a third insulating portion,
the first to third control electrodes being arranged in a first direction from the second electrode toward the first electrode,
the third control electrode being electrically insulated from the second control electrode by a fourth insulating portion provided between the second control electrode and the third control electrode,
the second control electrode being electrically insulated from the first control electrode by a fifth insulating portion provided between the first control electrode and the second control electrode,
the semiconductor part including a first layer of a first conductivity type, a second layer of a second conductivity type, a third layer of the first conductivity type, and a fourth layer of the second conductivity type,
the first layer extending between the first electrode and the second electrode, the second control electrode facing the first layer via the second insulating portion, the third control electrode being provided inside the first layer,
the second layer being provided between the first layer and the second electrode, the second layer facing the first control electrode via the first insulating portion,
the third layer being selectively provided between the second layer and the second electrode, the third layer contacting the first insulating portion and being electrically connected to the second electrode,
the fourth layer being provided between the first layer and the first electrode and electrically connected to the first electrode, wherein
the semiconductor part further includes a sixth layer of the first conductivity type, the sixth layer being provided between the first layer and the second layer, the sixth layer including a first conductivity type impurity with a higher concentration than a concentration of a first conductivity type impurity in the first layer, and
the first control electrode faces the sixth layer via the first insulating portion.

12. The semiconductor device according to claim 11, further comprising:

a third electrode provided between the first electrode and the second electrode, the third electrode extending through the semiconductor part in the first direction from the first electrode toward the second electrode, the third electrode being electrically insulated from the semiconductor part by an insulating film and electrically connected to the second electrode, the first and third electrodes being arranged in a second direction from the first control electrode toward the second layer of the semiconductor part, the third electrode facing the first layer and the second layer of the semiconductor part via the insulating film.

13. The semiconductor device according to claim 12, wherein a plurality of the second control electrodes is provided inside the semiconductor part, and one of the second control electrodes is provided between the first electrode and the third electrode.

* * * * *